United States Patent [19]

Leicht

[11] Patent Number: 4,636,406

[45] Date of Patent: Jan. 13, 1987

[54] METHOD AND APPARATUS FOR DISPENSING SOLDER PASTE

[75] Inventor: John L. Leicht, Hawthorn Woods, Ill.

[73] Assignee: Motorola, Inc., Schaumburg, Ill.

[21] Appl. No.: 687,886

[22] Filed: Dec. 31, 1984

[51] Int. Cl.⁴ .......................... H05K 3/12; H05K 3/34
[52] U.S. Cl. ...................................... 427/96; 29/829;
29/840; 427/282; 118/406
[58] Field of Search ................ 427/96, 282; 118/406,
118/410, 413, 415, 504; 101/129; 29/829, 840

[56] References Cited

U.S. PATENT DOCUMENTS

| | | | |
|---|---|---|---|
| 4,324,815 | 4/1982 | Mitani et al. | 427/96 |
| 4,469,044 | 9/1984 | Bloom et al. | 118/665 |
| 4,515,297 | 5/1985 | Schoenthaler | 427/96 |
| 4,515,304 | 5/1985 | Berger | 228/187 |

Primary Examiner—John D. Smith
Attorney, Agent, or Firm—Donald B. Southard

[57] ABSTRACT

A solder paste dispensing assembly provides for the controlled application of a predetermined solder paste pattern to a surface. The surface can be on a printed circuit board, prior to or after the board is mounted onto an assembled product or it can be a portion of the product itself. The surface can be a planar or non-planar surface.

11 Claims, 20 Drawing Figures

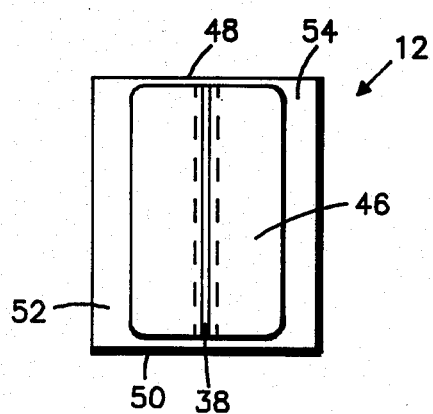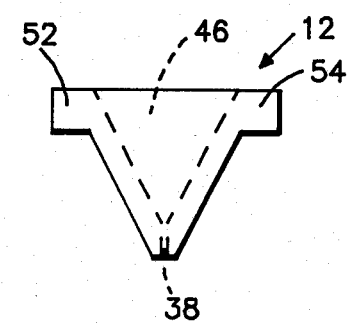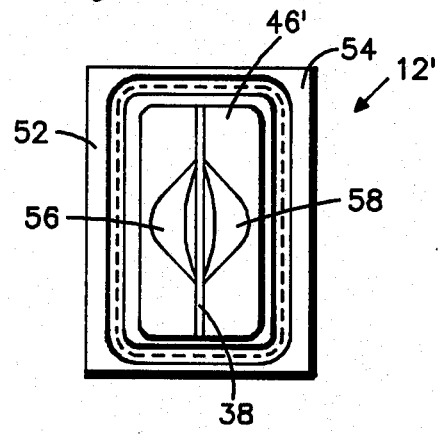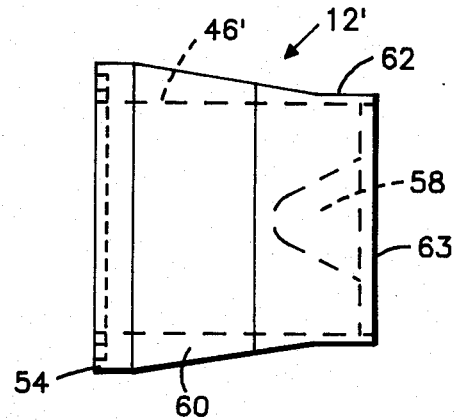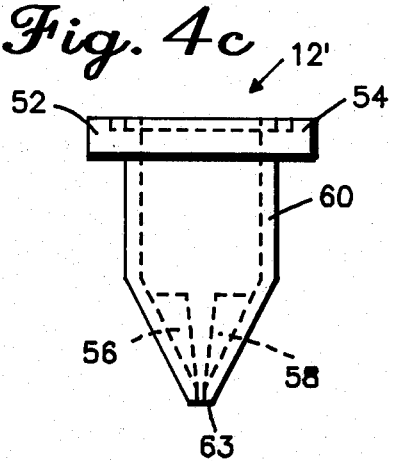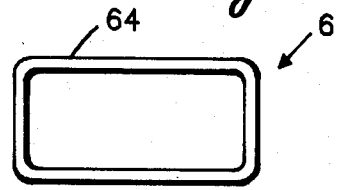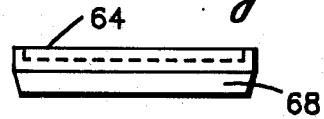

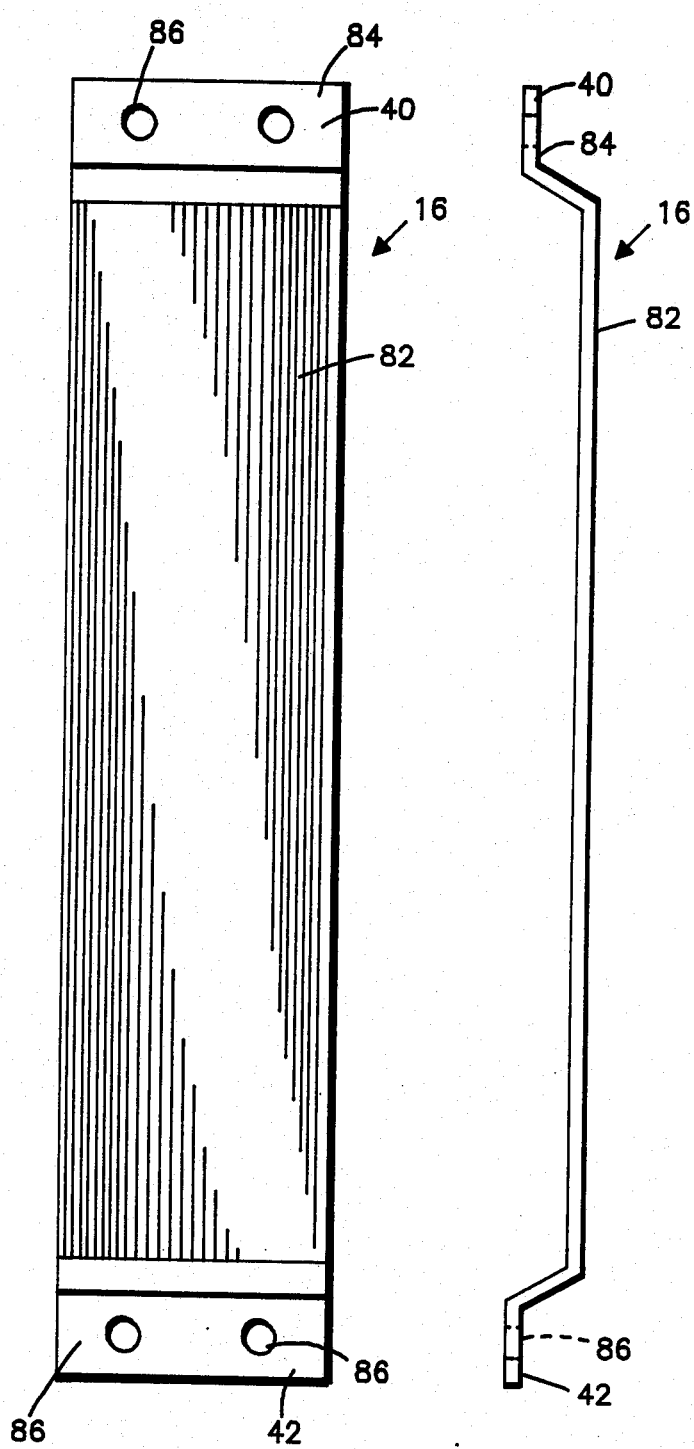
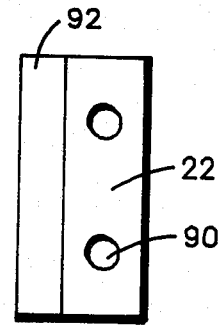
Fig. 8a  Fig. 8b
Fig. 9a
Fig. 9b

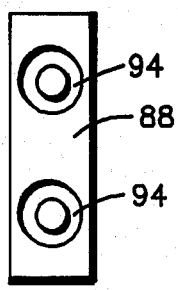
Fig. 10
Fig. 11
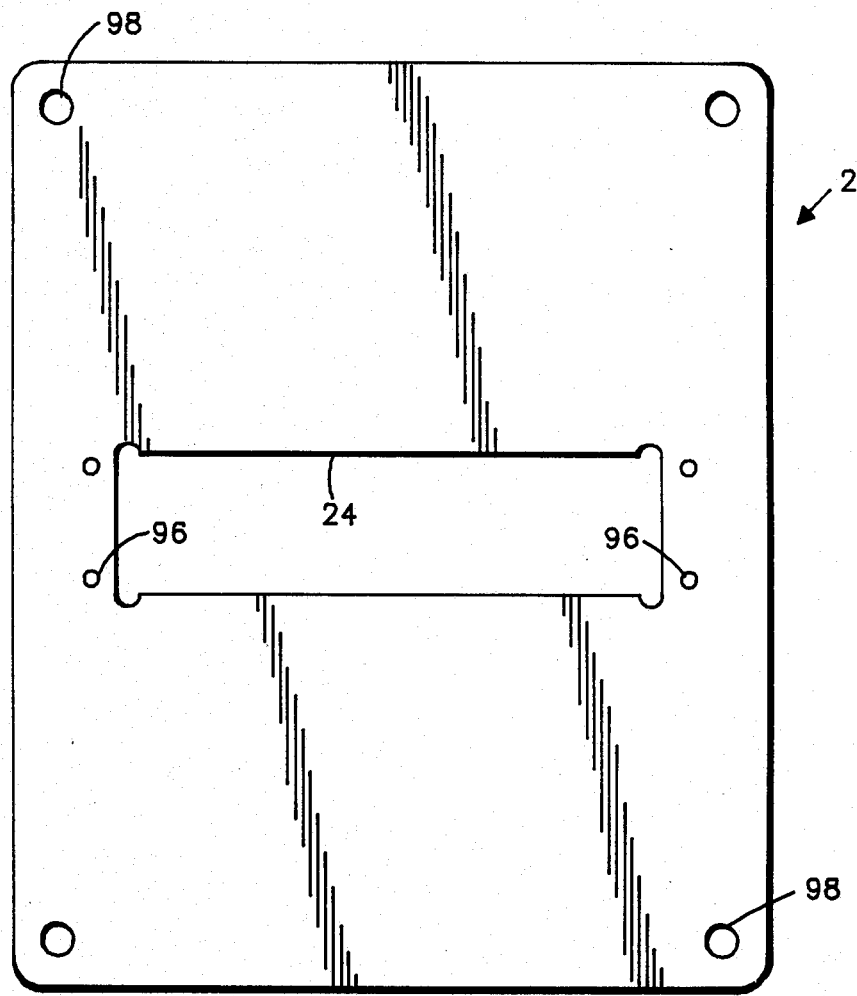

METHOD AND APPARATUS FOR DISPENSING SOLDER PASTE

FIELD OF THE INVENTION

The invention pertains to the field of solder paste application. More particularly, the invention pertains to a method and apparatus for dispensing solder paste in a controlled manner on planar or non-planar surfaces, which surfaces can be on mounted on non-mounted printed circuit boards or directly on a portion of an assembled or partially assembled product.

BACKGROUND

Printed circuit boards (hereinafter boards) are the basic building blocks of any type of electronic product. Further, as can be noted with virtually any electronic product, these products and the boards utilized therein, continually have been decreased in size without loss of any functions or with additional functions added thereto. For example, in mobile applications, such as vehicle two way communication radios, the standard radio size has been 3 by 18 by 24 inches. These radios typically were accommodated in the dash, in the body, in the trunk, under the seat or in the floor board of the vehicles. The design criterion for newer radios, now is on the order of 2½ by 7 by 12 inches, which allows installation under the dash of modern automobiles.

Along with the reduction in size has come the need and desire to utilize boards, which are nonplanar in shape and also to mount the boards to components during assembly. The boards desirably would be mounted before the circuits are applied thereto, to avoid stresses or other possible circuit defects in mounting the boards with the circuits already formed thereon. Further, it can be desirable to form the circuit right on a portion of the assembled product without mounting a separate board for the circuit.

Current techniques for applying solder paste patterns and electronic components are based on utilizing planar boards, which can be mounted on frames in the solder paste dispensing machines, such as screen printing machines. These machines are not easily adaptable to utilizing boards which are not planar, and cannot apply solder paste patterns to any type of assembled products. Further, these machines use a so-called puddle and squeegee technique for applying the solder paste to the boards. A puddle of solder paste is squeegeed across the boards which are individual planar defined units, so that the excess solder paste flowing off the sides and end of the boards does not cause a problem.

It is therefore a general object of the present invention to provide a method and apparatus for dispensing solder paste in a controlled manner onto planar boards.

It is a further object of the present invention to provide a method and apparatus for dispensing solder paste in a controlled manner onto non-planar boards.

It also is an object of the present invention to provide a method and apparatus for applying solder paste to boards mounted on an assembled or partially assembled product.

It is a still further object of the present invention to provide a method and apparatus for applying solder paste directly to a portion of a component of an assembled or partially assembled product.

SUMMARY OF THE INVENTION

The invention provides a method of dispensing solder paste onto a surface in a predetermined pattern. The method includes providing a solder paste dispenser head coupled to a solder paste supply and having a dispensing opening through which the solder paste can be extruded, applying a stencil of the predetermined solder paste pattern onto the surface, applying the dispenser head to the stenciled pattern and moving the head across the pattern while extruding the solder paste from the head onto the pattern and removing the head and stenciled pattern from the surface forming the predetermined solder paste pattern on the surface.

This invention further provides an apparatus for dispensing solder paste onto a surface in a predetermined pattern. The apparatus includes solder paste dispensing means adapted to be coupled to a solder paste supply and having a dispensing opening therein through which the solder paste is extruded, means for applying a stencil of the solder paste pattern onto the surface, means for applying the dispensing means to and moving the dispensing means across the stenciled pattern while extruding the solder paste onto the pattern and means for removing the dispensing means and pattern from the surface to form the solder paste pattern thereon.

The invention also provides an assembly for dispensing solder paste onto a surface in a predetermined pattern. The assembly includes solder paste dispensing means adapted to be coupled to a solder paste supply and including a dispensing head having a dispensing opening therein for extruding the solder paste therethrough, means for applying a stencil of the solder paste pattern onto the surface including mounting plate means for mounting the stencil onto the surface, means for applying the head to and moving the head across the stenciled pattern while extruding the solder paste onto the pattern and means for removing the head and stenciled pattern from the surface to form the solder paste pattern thereon.

BRIEF DESCRIPTION OF THE DRAWINGS

The features of the present invention which are believed to be novel are set forth with particularity in the appended claims. The invention, together with further objects and advantages thereof, can be best understood by making reference to the following description taken in conjunction with the accompanying drawings, in the several figures of which like reference numerals identify identical elements, and wherein:

FIGS. 3A and 3B are one embodiment of the solder paste dispensing head of the present invention;

FIGS. 4A, 4B and 4C illustrate another embodiment of the solder paste dispensing head of the present invention;

FIGS. 5A and 5B are one embodiment of a piston for the dispensing head of the present invention;

FIGS. 8A and 8B are one embodiment of a stencil which can be utilized in the present invention;

FIGS. 9A and 9B are one embodiment of a bracket for the stencil;

FIG. 10 is one embodiment of a bracket clamp for the stencil; and

FIG. 11 is one embodiment of a mounting plate for the stencil.

DESCRIPTION OF THE PREFERRED EMBODIMENTS

Figure 1:
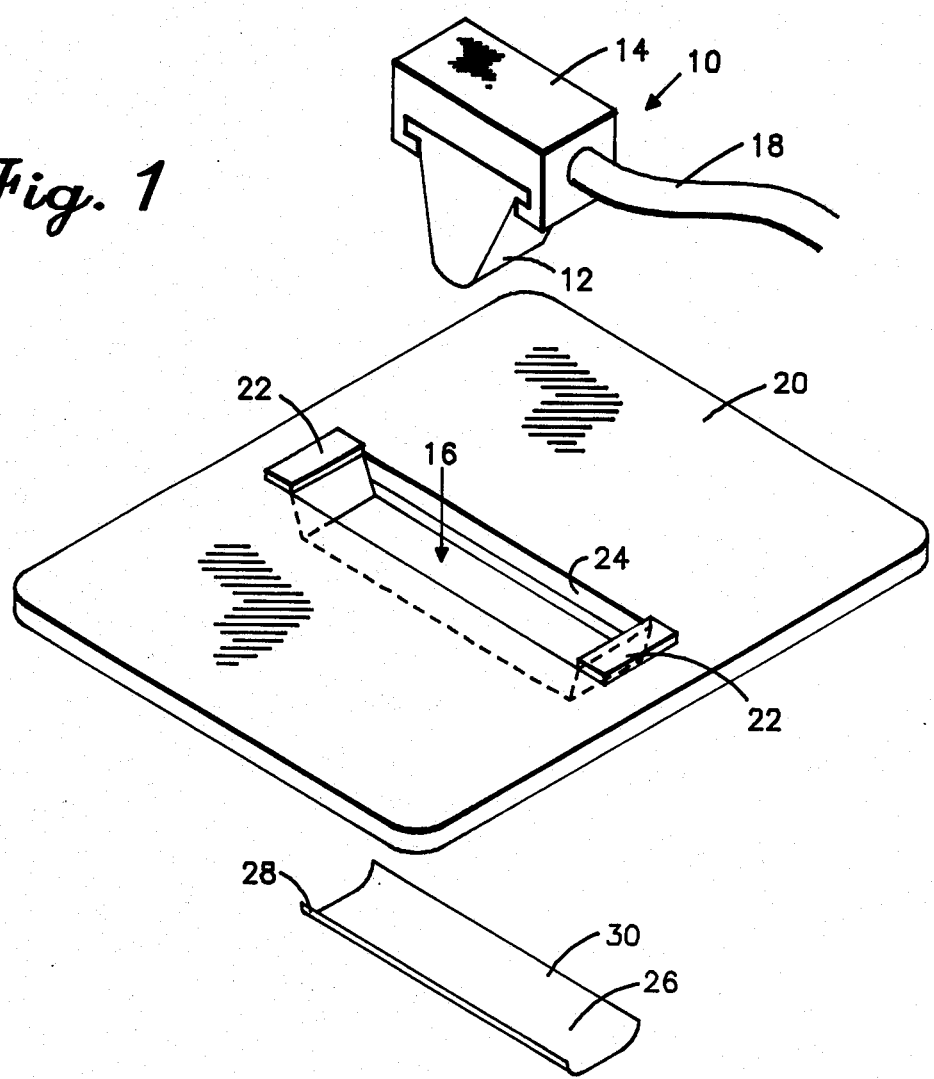
FIG. 1 is a perspective view of one embodiment of a solder paste dispensing assembly of the present invention including a solder paste dispensing head, a stencil, mounting plate and board.

Referring now to FIG. 1, one embodiment of a solder paste dispensing assembly or solder paste dispenser 10 of the present invention is best illustrated. The dispenser 10 includes a solder paste dispensing head 12, which can be mounted in a mounting bracket 14. The bracket 14 can be mounted into any type of apparatus, which will move the head 12 against and across a stencil 16. The apparatus can be, for example, a conventional screen printer which includes a vertical and horizontal moving actuator.

Solder paste in the head 12 can be dispensed or extruded by applying air pressure through a hose 18, when the head 12 is operatively moved against and across the stencil 16. The stencil 16 can be mounted onto a mounting plate 20 by a pair of brackets 22 and can extend through an opening or slot 24 in the plate 20. The plate 20 is clamped against a board 26, which is illustrated as having a pair of upturned sides 28 and 30.

The method and apparatus of the invention can be utilized to dispense solder paste in a controlled manner onto a planar board or onto a nonplanar board 26, which has at least one or more upturned sides or recesses preformed therein. Further, although illustrated utilizing the stencil 16, the stencil pattern can be directly applied to the board or to a portion of a component of a preassembled or partially assembled product. Further, the dispenser 10 can be utilized to apply solder paste in a controlled manner, even to curved surfaces to further increase the packing density of the components, if desired.

Figure 2A:
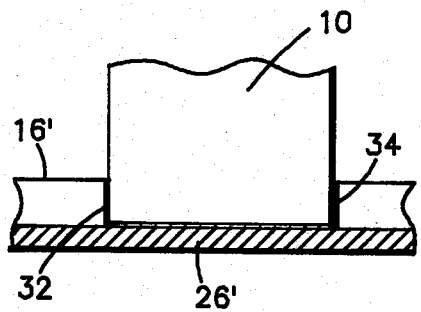
FIGS. 2A and 2B are partial side sectional views of the dispensing head applying solder paste to a board.

FIG. 2A illustrates the dispenser 10 applying solder paste to a stencil 16', which has raised sides 32 and 34. In utilizing the dispenser 10 with a stencil 16' or a board 26' which has raised sides, the sides of the dispenser can be open, since the raised sides of the stencil 16' will confine the solder paste. It is preferable; however, that the dispenser 10 has closed sides so that the solder paste is confined and only is extruded against the stencil pattern of the stencil 16'.

Figure 2B:
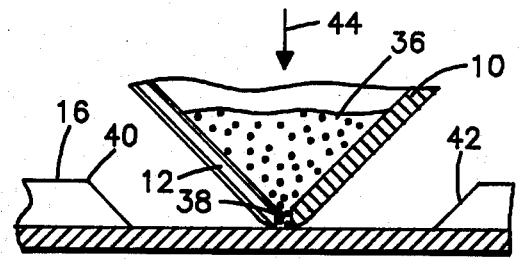

FIG. 2B illustrates the dispensing of solder paste 36 from the dispenser 10 through a slot 38 in the bottom of the head 12 onto the stencil 16. The slot 38 preferably has an opening width in the range of 0.015 to 0.125 inches, preferably 0.045 to 0.065 inches. The dispenser 10 is moved down against the stencil 16, between raised ends 40 and 42 thereof, and then moved across the stencil 16 to dispense the solder paste 36. The solder paste 36 is extruded through the slot 38 by the application of air pressure as illustrated by arrow 44. The pressure applied can be a relatively low pressure in the range of 2 to 15 psi. The air pressure is applied only when the head 12 is against the stencil 16, which thus provides the controlled dispensing of the solder paste 36.

The pressure applied to the solder paste 36 in the dispenser head 12 depends upon the width of the slot 38 as well as the viscosity of the solder paste 36. The performance of the dispenser 10 is chosen depending upon the stencil pattern to which the solder paste pattern is to be applied. For a fine (small opening) pattern, a thin (low) viscosity solder paste is chosen along with a narrow width opening for the slot 38. For a coarse (larger opening) pattern, a thick (high) viscosity solder paste is chosen along with a wider width opening for the slot 38. One suitable solder paste which can be utilized in practicing the invention is sold by Alpha Metals Inc. under the batch number 60Sn/40Pb RMA 376 EHX. Further, when utilizing the method and apparatus of the invention with stencil patterns which have very large openings, especially immediately adjacent small openings, the solder paste coverage may not be uniform or even a complete coverage of the desired solder paste pattern. Therefore, the non-uniform coverage can be eliminated by leaving small grid lines periodically across the large openings against which the solder paste can be squeegeed to ensure uniform and complete coverage.

FIGS. 3A and 3B illustrate a first embodiment of the dispensing head 12. The head 12 includes an internal solder paste reservoir 46, which communicates with the slot 38. The slot 38 has closed sides 48 and 50 to better control the dispensing of the solder paste, as described above. The head 12 also includes a pair of upper flanges 52 and 54, which can be utilized to mount the head 12 in the bracket 14. The head 12 preferably is formed as a unitary unit, although it can also be formed of separate pieces which can be bolted, glued or otherwise secured together. The head 12 can be formed of any type of material, which preferably can be formed into the unitary unit, which material will not chemically react with the chemicals in the solder paste, such as nylon, synthetic resin polymers, such as sold under the trademark "Teflon", or other moldable polymers.

FIGS. 4A, 4B and 4C illustrate a second embodiment 12' of the dispensing head of the present invention. The head 12' includes an elongated reservoir 46' to hold a larger volume of solder paste. The reservoir 46' also includes a pair of matching protrusions 56 and 58 which help to ensure that the solder paste is extruded evenly through the slot 38, without air leaks which could be caused by the pressure difference along the slot 38 without the protrusions 56 and 58. The head 12' has a tapered body 60 which is terminated by a straight sided portion 62, which facilitates the use of the head 12' inside of a stencil with one or more raised sides or in the stencil assembly shown in FIG. 1. A bottom edge 63 of the body 60 forms a squeegee surface for the head 12'.

FIGS. 5A and 5B illustrate a piston 64 which preferably is utilized in the reservoir 46' of the dispensing head 12'. The piston 64 helps to ensure that the solder paste will flow evenly out of the slot 38, without forming an air pressure leak (as discussed above) which would prevent the controlled distribution of the solder paste from the head 12'. The piston 64 preferably includes a recess 66 and a beveled edge 68, which also helps to ensure that the piston 64 moves evenly through the reservoir 46' and that the solder paste is evenly dispensed.

Figure 6:
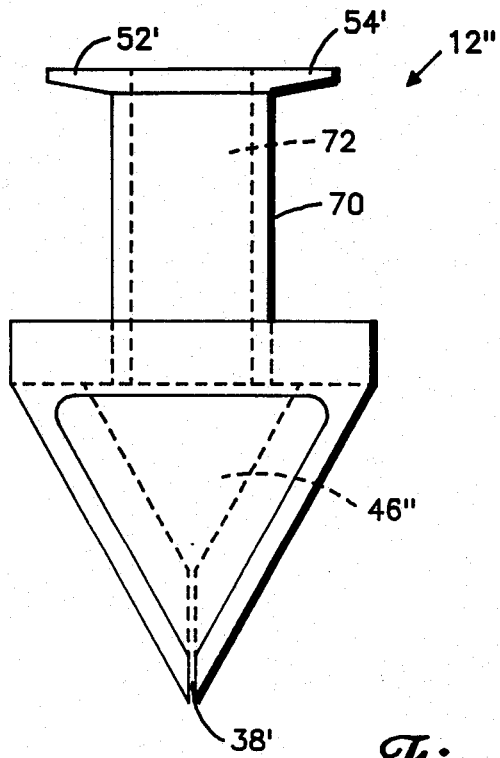
FIG. 6 is another embodiment of the solder paste dispensing head of the present invention.

FIG. 6 illustrates still another embodiment 2" of the dispensing head. The head 12" includes an upstanding member 70, which can include an internal channel 72, which communicates with the reservoir 46" and which can accommodate the solder paste piston 64 (not illustrated). The member 70 includes a pair of flanges 52' and 54' which can be utilized to mount the head 12" into a holder, such as the bracket 14. The slot 38' is illustrated as having open sides, but it preferably also would have closed sides. Again, the head 12" can be made in a single molded piece or in one or more pieces secured together. Although each of the dispensing heads 12, 12' and 12" have been illustrated as having an internal solder paste reservoir 46, 46' and 46", the heads also can be just coupled to a separate solder paste supply, such as through tubing (not illustrated). Further, the connection can be without the reservoir and/or piston therein or can be in combination therewith. The separate supply can be preferred since the solder paste mixture can settle out if it is left unstirred for an extended period of time.

Figure 7A:
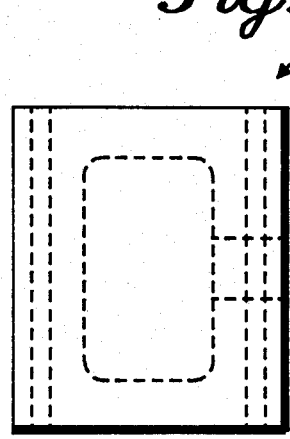
FIGS. 7A, 7B and 7C are one embodiment of a mounting bracket for the dispensing head.
Figure 7B:
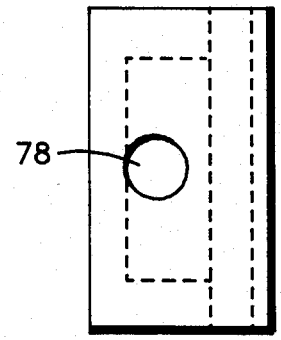
Figure 7C:
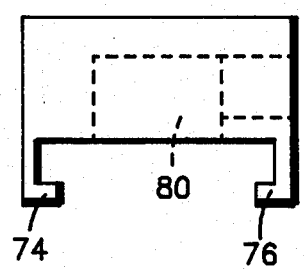

The holder or bracket 14 is best illustrated in FIGS. 7A, 7B and 7C. The holder 14 includes a pair of L-shaped arms 74 and 76, which are shaped preferably to frictionally engage the flanges 52 and 54 of the head 12. The holder 14 includes a passageway or fitting 78 to accommodate the air hose 18. The air hose 18 communicates through the passageway 78 and a recess 80 with the open end of the reservoir 46 when the head 12 is inserted into the holder 14. Either the holder 14 or the head 12 preferably will include a seal (not shown) around the recess 80 and the reservoir 46 to ensure that the pressurized air does not leak between the assembled parts. The holder 14 can be formed from any convenient substantially rigid material, such as aluminum.

One embodiment of the stencil 16 which can be utilized with the present invention is best illustrated in FIGS. 8A and 8B. The stencil 16, preferably is formed from a somewhat flexible metal sheet, such as 0.010 inches thick stainless steel. The solder paste pattern (not illustrated) is formed on a planar portion 82 of the stencil 16, such as by etching the pattern through the stencil. The stencil 16 includes the raised ends 40 and 42, which include planar end pieces 84 and 86. The end pieces 84 and 86 each have two or more apertures 86, which are utilized to mount the stencil 16, somewhat in tension, to the mounting plate 20.

The stencil 16 preferably is mounted to the mounting plate 20 utilizing the brackets 22 (FIGS. 9A and 9B) and a pair of bracket clamps 88 (one of which is illustrated in FIG. 10). The brackets 22 also have at least two apertures 90 which mate with the apertures 86. The brackets 22 include an upstanding tab 92 which can be utilized to apply the preferred slight tension to the stencil 16 when it is mounted to the plate 20. The bracket clamps 88 include at least two recessed apertures 94, which mate with the apertures 86 and 90 and which are recessed to accommodate bolt heads (not illustrated) which can be utilized to mount the stencil 16 to the plate 20 or to another holder or substrate. Both the brackets 22 and the bracket clamps 88 can be made from a rigid metal, such as stainless steel 0.040 inches and 0.125 inches thick, respectively.

One embodiment of the mounting plate 20 is best illustrated in FIG. 11. The plate 20 includes at least two preferably tapped apertures 96, at each end of the stencil slot 24. The tapped apertures 96 match the apertures 86, 90 and 94 and accommodate bolts or screws threaded therein to mount the stencil 16. The plate 20 further includes a plurality of apertures 98, also preferably tapped, which accommodate bolts or screws threaded therethrough to mount the plate 20 to a surface, with or without the board 26 aligned thereunder, prior to the solder paste application. The width of the opening 24 is not critical and merely is selected as needed to accommodate the configuration of the board 26 or other surface.

The present invention therefore provides an improved method and apparatus for controlling the application of a predetermined solder paste pattern to a surface. The solder paste pattern can be applied to planar or non-planar surfaces or boards and can be applied to boards prior to assembly of the product, during assembly or after the product is assembled. The solder paste pattern can also be applied directly to a portion of an assembled or partially assembled product without a separate board.

While the present invention has been described in terms of specific embodiments, it will be understood that the broader aspects of the invention encompass solder paste dispensing methods and configurations which can vary significantly from those illustrated, while still providing the improved controlled solder paste dispensing of the invention.

What is claimed is:

1. A method of dispensing solder paste onto a surface in a predetermined pattern, said method comprising:
   providing a solder paste dispenser head coupled to a solder paste supply, said head having a dispensing opening therein through which said solder paste can be extruded;
   providing a stencil assembly having a predetermined pattern and raised sides and ends;
   applying said dispenser head to said stenciled pattern and moving said head across said stenciled pattern while extruding said solder paste from said head onto said stenciled pattern with said raised sides and ends on said stencil assembly containing the movement of said dispenser head and thereby selectively controlling the application of said solder paste; and
   removing said head and said stenciled pattern from said surface forming said predetermined solder paste pattern on said surface.

2. The method as defined in claim 1 including providing a printed circuit board with said surface thereon.

3. The method as defined in claim 2 including applying said stencil, said solder paste and forming said predetermined solder paste pattern prior to mounting said printed circuit board onto an assembled product.

4. The method as defined in claim 2 including mounting said printed circuit board onto an assembled or partially assembled product prior to applying said stencil, said solder paste and applying said predetermined solder paste pattern to said printed circuit board surface.

5. The method as defined in claim 2 including providing said printed circuit board surface with at least one discontinuity therein forming a non-planar surface on said printed circuit board.

6. The method as defined in claim 1 including providing said surface on a portion of an assembled or partially assembled product.

7. The method as defined in claim 6 including providing said surface of said portion with at least one discontinuity therein forming a nonplanar surface portion.

8. The method as defined in claim 1 including forming an internal solder paste reservoir for said solder paste supply in said dispenser head.

9. The method as defined in claim 8 including extruding said solder paste by applying pressure to said solder paste reservoir.

10. The method as defined in claim 9 including a piston in said reservoir which can move under forces applied thereto and applying said pressure to said piston to extrude said solder paste through said dispensing opening.

11. The method as defined in claim 1 including utilizing said solder paste dispenser head as a squeegee for said solder paste as it is dispensed.

* * * * *